United States Patent
Suzuki et al.

(10) Patent No.: US 9,961,776 B2
(45) Date of Patent: May 1, 2018

(54) METHOD OF PRODUCING CURED PRODUCT AND METHOD OF FORMING PATTERN

(71) Applicant: CANON KABUSHIKI KAISHA, Tokyo (JP)

(72) Inventors: Tatsuya Suzuki, Kawasaki (JP); Toshiki Ito, Kawasaki (JP); Chieko Mihara, Isehara (JP)

(73) Assignee: Canon Kabushiki Kaisha, Tokyo (JP)

( * ) Notice: Subject to any disclaimer, the term of this patent is extended or adjusted under 35 U.S.C. 154(b) by 601 days.

(21) Appl. No.: 14/366,250

(22) PCT Filed: Dec. 12, 2012

(86) PCT No.: PCT/JP2012/082982
§ 371 (c)(1),
(2) Date: Jun. 17, 2014

(87) PCT Pub. No.: WO2013/094660
PCT Pub. Date: Jun. 27, 2013

(65) Prior Publication Data
US 2014/0363584 A1   Dec. 11, 2014

(30) Foreign Application Priority Data

Dec. 19, 2011   (JP) ................................ 2011-277713

(51) Int. Cl.
*H05K 3/00*   (2006.01)
*H01L 21/308*   (2006.01)

(52) U.S. Cl.
CPC ........... *H05K 3/00* (2013.01); *H01L 21/3086* (2013.01); *H05K 2203/0502* (2013.01)

(58) Field of Classification Search
None
See application file for complete search history.

(56) References Cited

U.S. PATENT DOCUMENTS

| 2006/0255505 | A1* | 11/2006 | Sandhu | B82Y 10/00 264/293 |
|---|---|---|---|---|
| 2010/0078860 | A1 | 4/2010 | Yoneda | |
| 2010/0248163 | A1 | 9/2010 | Ito | |

FOREIGN PATENT DOCUMENTS

| JP | 2010-103464 A | 5/2010 |
|---|---|---|
| JP | 2010-232356 A | 10/2010 |

(Continued)

*Primary Examiner* — Robert S Walters, Jr.
(74) *Attorney, Agent, or Firm* — Canon U.S.A. Inc., IP Division

(57) ABSTRACT

The present invention provides a photo-curable composition that requires a small mold-releasing force in a method of producing a cured product and also provides a method of producing a cured product with a small mold-releasing force. The method of producing a cured product includes applying a photo-curable composition onto a base material; pressing a mold to the photo-curable composition to form a pattern in the photo-curable composition; irradiating the photo-curable composition provided with the pattern with first light to generate a cured product having the pattern; and releasing the mold from the cured product, wherein a gas-generating region is formed from a gas-generating agent between the cured product and the mold; the gas-generating region is irradiated with second light to generate a gas in the gas-generating region; and the mold is released from the cured product after the generation of the gas or simultaneously with the generation of the gas.

7 Claims, 4 Drawing Sheets

(56) References Cited

FOREIGN PATENT DOCUMENTS

| JP | 2010-262980 A | 11/2010 |
| JP | 2011-230430 A | 11/2011 |
| JP | 2011-245821 A | 12/2011 |
| WO | 2010005032 A1 | 1/2010 |

* cited by examiner

METHOD OF PRODUCING CURED PRODUCT AND METHOD OF FORMING PATTERN

TECHNICAL FIELD

The present invention relates to a method of producing a cured product and a method of forming a pattern.

BACKGROUND ART

In semiconductor integrated circuits, refinement and integration have been developed, and accuracy in photolithographic apparatus as a technology for forming patterns has been increased to achieve micromachining by the apparatus. The photolithographic technology, however, has almost reached a limit by that the machining accuracy required has get close to the diffraction limit of exposure light.

In order to further promote refinement and high accuracy, proposed is a photo-nanoimprint method, where a mold having a fine pattern of protrusions and depressions is pressed to a resist that has been applied to a substrate to transfer the pattern of the mold to the resist film on the substrate.

In particular, special attention has been given to a photo-nanoimprint method for producing a fine resist pattern on a substrate by pressing a mold transparent against exposure light to a photo-curable composition applied onto a substrate, curing the photo-curable composition by light irradiation, and detaching the mold from the cured product.

The photo-nanoimprint method, however, has a problem that a large mold-releasing force is necessary for releasing the mold from the cured product. In some cases, the large mold-releasing force causes defects in the pattern or reduces the accuracy in alignment by floating of the substrate from the stage on which the substrate placed.

Against such a problem, PTL 1 describes a method for reducing the mold-releasing force by generating a gas between a mold and a resist by adding a gas-generating agent that generates a gas by means of light or heat to a photo-curable composition.

PTL 2 describes a method for generating a gas between a mold and a resist by placing a photocatalyst on the surface of the mold and performing light irradiation to decompose the resist being in contact with the mold through oxidation by the photocatalyst.

In the method described in PTL 1, since the photo-curable composition contains the gas-generating agent, bubbles are easily generated in the cured product by the generation of a gas.

In the method described in PTL 2, since the gas is generated by directly oxidizing the surface of a photo-cured product to decompose it, the surface of the photo-cured product is substantially deteriorated.

That is, the above-described two methods hardly increase the accuracy in pattern prepared as a cured product.

CITATION LIST

Patent Literature

PTL 1 Japanese Patent Laid-Open No. 2010-262980
PTL 2 Japanese Patent Laid-Open No. 2010-103464

SUMMARY OF INVENTION

The present invention provides a method of producing a cured product and a method of forming a pattern with high pattern accuracy by reducing the mold-releasing force.

In the method of producing a cured product according to the present invention, the cured product is produced by applying a photo-curable composition onto a base material; pressing a mold to the photo-curable composition to form a pattern in the photo-curable composition; irradiating the photo-curable composition provided with the pattern with first light to generate a cured product having the pattern; and releasing the mold from the cured product, wherein a gas-generating region is formed from a gas-generating agent between the cured product and the mold; the gas-generating region is irradiated with second light to generate a gas in the gas-generating region; and the mold is released from the cured product after the generation of the gas or simultaneously with the generation of the gas.

In the method of forming a pattern according to the present invention, a pattern of protrusions and depressions is formed in a cured product by applying a photo-curable composition onto a base material; bringing a mold having a pattern of protrusions and depressions on its surface into contact with the photo-curable composition to form a pattern reversely corresponding to the protrusions and depressions of the mold in the photo-curable composition; irradiating the photo-curable composition provided with the pattern with first light to generate a cured product having the pattern; and releasing the mold from the cured product, wherein a gas-generating region is formed from a gas-generating agent between the cured product and the mold; the gas-generating region is irradiated with second light to generate a gas in the gas-generating region; and the mold is released from the cured product after the generation of the gas or simultaneously with the generation of the gas.

According to the present invention, the mold-releasing force can be reduced by selectively arranging a gas-generating agent between a mold and a cured product, while maintaining the accuracy of the pattern. The present invention thus provides a method of providing a pattern to a cured product at high pattern accuracy with a small mold-releasing force.

Further features of the present invention will become apparent from the following description of exemplary embodiments with reference to the attached drawings.

DESCRIPTION OF EMBODIMENTS

Embodiments of the present invention will now be described in detail. The present invention is not limited to the following embodiments, and the embodiments can be appropriately modified and improved on the basis of knowledge of those skilled in the art within the scope not departing from the gist of the present invention. Such modifications and improvements are encompassed in the present invention.

In the method of producing a cured product according to the present invention, the cured product is produced by applying a photo-curable composition onto a base material;

pressing a mold to the photo-curable composition to form a pattern in the photo-curable composition; irradiating the photo-curable composition provided with the pattern with first light to generate a cured product having the pattern; and releasing the mold from the cured product, wherein a gas-generating region is formed from a gas-generating agent between the cured product and the mold; the gas-generating region is irradiated with second light to generate a gas in the gas-generating region; and the mold is released from the cured product after the generation of the gas or simultaneously with the generation of the gas.

In the present invention, the first light and the second light may be different types from each other or may be the same type. Irradiation with second light may be performed after irradiation with first light or may be performed during irradiation with first light. Alternatively, irradiation with first light and second light may be simultaneously performed.

The method of the present invention can be applied to photo nanoimprint method. The photo-nanoimprint method in the present invention refers to the formation of a pattern with a size of 1 nm to 10 mm, in particular, a size of 10 nm to 100 µm. The pattern of the resulting cured product reflects the protrusions and depressions of the mold, i.e., the protrusions and depressions of the cured product reversely corresponds to the protrusions and depressions on the mold surface.

As a pattern shape, for example, a rectangular parallelepiped cured product of a rectangle having a width of 1 nm to 10 mm and a length of 1 nm to 10 mm can be formed at a predetermined position on a substrate. Various patterns can be formed in cured products depending on the protrusions and depressions on the mold surfaces. The pattern of a cured product having a shape such as a hemisphere, a sphere, a cone, a cylinder, or a frustum can be formed on a substrate.

In the present invention, the photo-curable composition refers to a composition in the state before curing, and the composition cured by light irradiation is defined as a cured product.

The cured product is not limited to a completely cured product, and a partially cured product or a product in a semihardened state such that an increase in viscosity of the composition is detected are also defined as cured products.

The present invention will be described in detail by the embodiments below.

Figure 1:
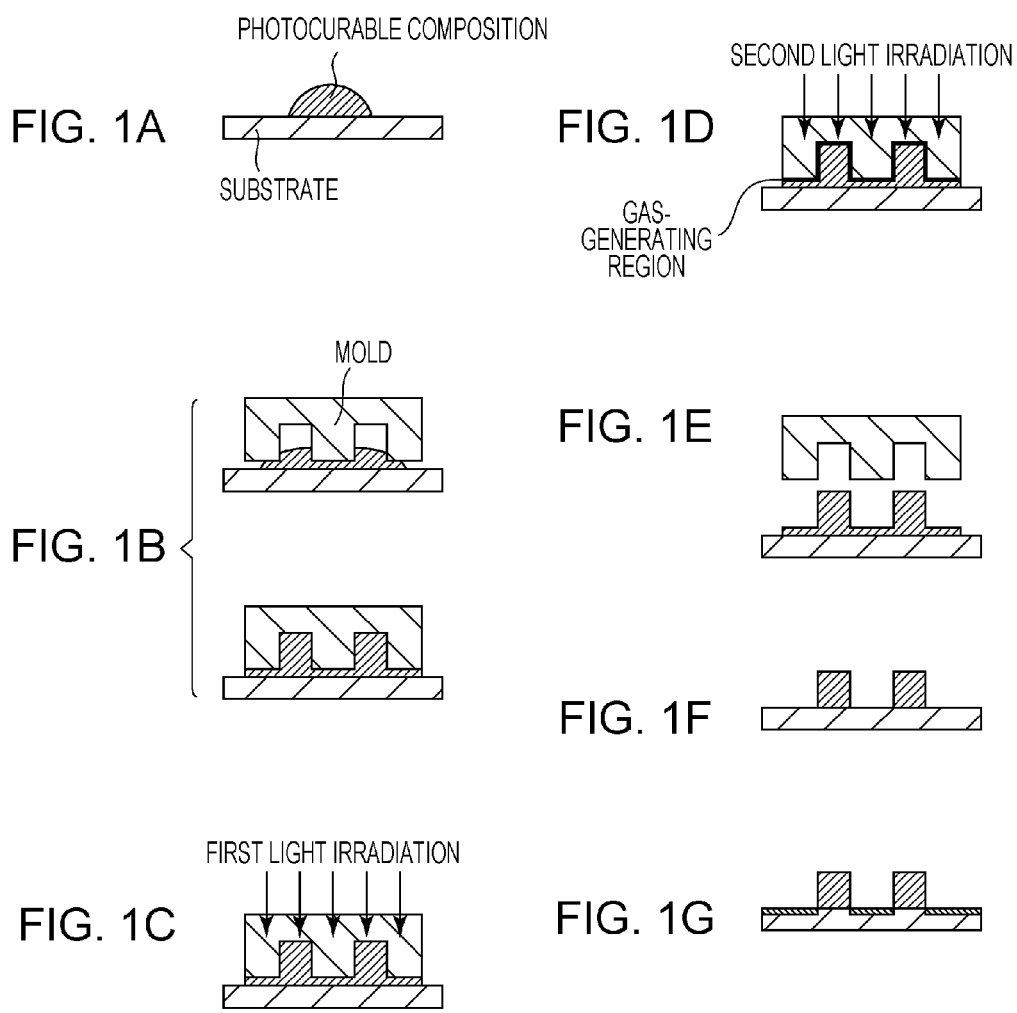
FIGS. 1A to 1G are cross-sectional views illustrating a first embodiment of a method of producing a cured product.
Figure 2:
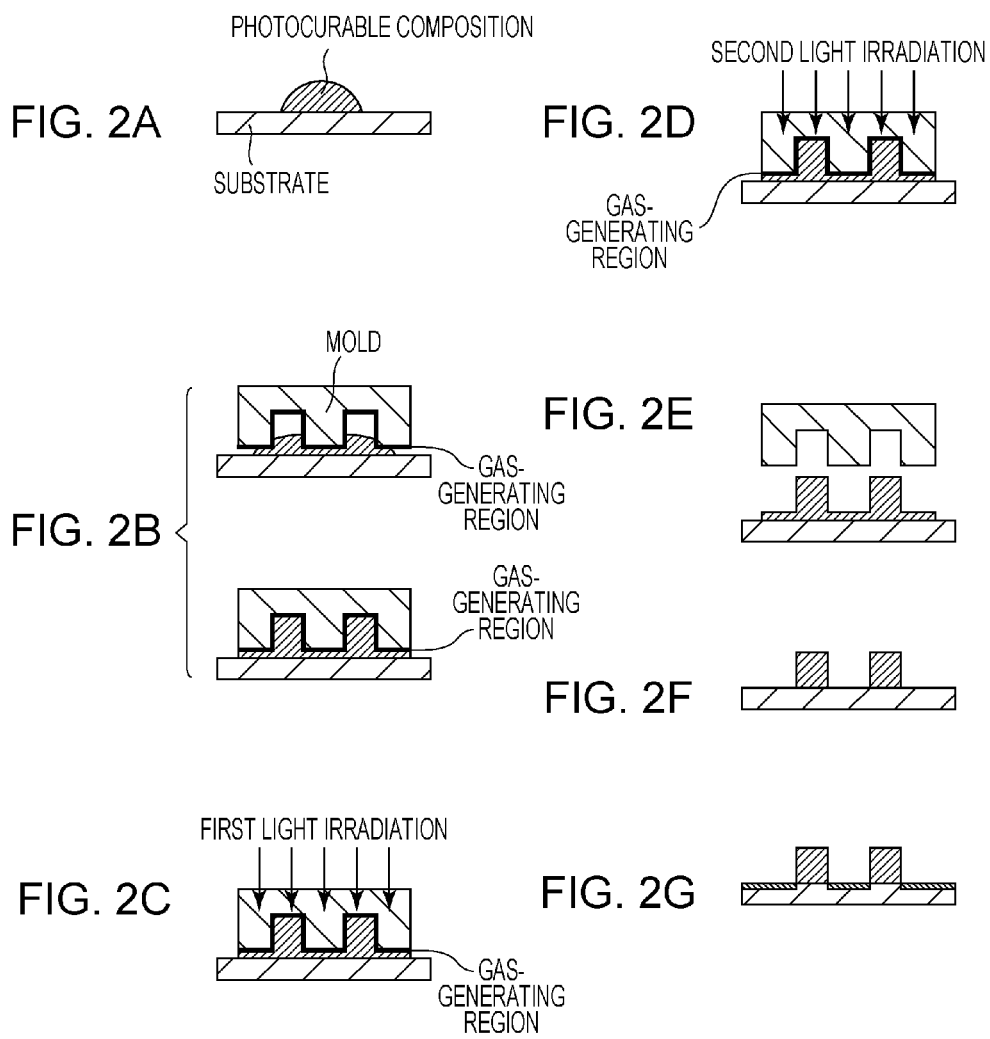
FIGS. 2A to 2G are cross-sectional views illustrating a second embodiment of a method of producing a cured product.

The method of producing a cured product according to each embodiment includes a step of applying a photo-curable composition onto a substrate (application step, shown in FIG. 1A or 2A); a step of pressing a mold to the photo-curable composition to form a pattern in the photo-curable composition (pressing step, shown in FIG. 1B or 2B); a step of irradiating the photo-curable composition provided with the pattern with first light to generate a cured product having the pattern (curing step, shown in FIG. 1C or 2C); and a step of releasing the mold from the cured product (mold-releasing step, shown in FIG. 1E or 2E).

The method of each embodiment is characterized in that, as shown in FIG. 1D or 2D, a gas-generating region is formed from a gas-generating agent between the cured product and the mold, that the gas-generating region is irradiated with second light to generate a gas in the gas-generating region (gas-generating step), and that the mold is released from the cured product after the generation of the gas.

The gas-generating agent for forming the gas-generating region may be supplied from the photo-curable composition, may be supplied from the cured product, or may be supplied from the photo-curable composition during the curing.

The gas-generating agent may be applied to the surface of a mold in advance for forming a gas-generating region.

Furthermore, in order to accelerate the gasification of the gas-generating agent, a photocatalyst such as a titanium dioxide may be disposed on the surface of the depression portion and/or the protrusion portion of the mold.

In an aspect of the present invention, the method according to each embodiment may include, after the step of releasing the mold from the cured product, a step of removing the film remaining at the depression portion of the cured product by etching to expose the substrate to the surface (remaining film-removing step, shown in FIG. 1F) and a step of processing the exposed surface of the substrate by etching or ion implantation (substrate-processing step, shown in FIG. 1G).

The photo-curable composition used in the present invention is cured by means of light and contains at least a polymerizable monomer (A) and a photopolymerization initiator (B). Furthermore, the photo-curable composition optionally contains a gas-generating agent having a segregating property. The photo-curable composition may further contain other components. Examples of the light for irradiation include infrared light, visible light, ultraviolet light, far ultraviolet light, X-rays, charged particle rays such as electron rays, and radiation rays.

Each step of the method of each embodiment will now be described in detail.

Aspects of the present invention will be described by First Embodiment shown in FIGS. 1A to 1G and Second Embodiment shown in FIGS. 2A to 2G.

In the aspect according to First Embodiment, a gas-generating region is formed from a gas-generating agent having a segregating property between a cured product and a mold. In the aspect according to Second Embodiment, a gas-generating region is formed on the surface of a mold in advance, and the mold having the gas-generating region is pressed to a photo-curable composition to dispose the gas-generating region of the gas-generating agent between a cured product and a mold. In both aspects, a gas-generating region is formed from a gas-generating agent between a cured product and a mold, the gas-generating region is irradiated with second light to generate a gas in the gas-generating region, and the mold is released from the cured product after the generation of the gas or simultaneously with the generation of the gas.

First Embodiment

The present invention will now be described in detail by First Embodiment.

Application Step (FIG. 1A)

In the application step, a photo-curable composition is applied onto a substrate as a layer to which a pattern is transferred (pattern-receiving layer). Though the substrate to be processed is usually a silicon wafer, another substrate selected from substrates known as semiconductor device substrates made of, for example, aluminum, a titanium-tungsten alloy, an aluminum-silicon alloy, an aluminum-copper-silicon alloy, silicon oxide, or silicon nitride can also be used.

Furthermore, the pattern of a cured product may be formed on the surface of a substrate itself, as in the pattern of a diffractive optical element. In such a case, since it is not necessary to process the substrate itself, the substrate may be one made of a resin such as a polycarbonate resin, an acrylic resin, or polyethylene.

The pattern in the present invention refers to a shape having protrusions and depressions derived from the surface having protrusions and depressions of a mold and refers to a shape formed in a photo-curable composition by pressing the mold to the photo-curable composition.

Formation of a wiring pattern or a pattern surrounding a semiconductor device region on a substrate allows treatment, such as etching or ion implantation, of a specific region.

That is, the pattern of the present invention can be defined as a matter that forms at least protrusions and depressions in the direction perpendicular to the surface of a substrate.

In First Embodiment, the gas-generating agent used in the gas-generating step described below is added to the photo-curable composition. The gas-generating agent used herein also has properties as a surfactant and segregates at the interface between a mold and a curable composition. Accordingly, a gas-generating region can be formed from the gas-generating agent between a cured product and a mold before the gas-generating step.

The amount of a gas generated in the gas-generating region can be controlled by appropriately adjusting the amount of the gas-generating agent by considering the molecular weight and the reaction to pressure by the gas-generating agent used. For example, in the case of using an azide compound as the gas-generating agent, a nitrogen gas having a volume of about 2 to 50 times that of the gas-generating agent can be generated. As a result, the nitrogen gas accumulates at the interface between the photo-curable composition and the mold to generate a pressure for releasing the mold from the photo-curable composition. The pressure serves as a force for releasing the mold from the photo-curable composition to reduce the mold-releasing force necessary for releasing the mold from the photo-curable composition.

The substrate may be subjected to surface treatment for enhancing the adhesion with the photo-curable composition. Examples of the method of application of the photo-curable composition include coating such as ink jetting, dip coating, air knife coating, curtain coating, wire bar coating, gravure coating, extrusion coating, spin coating, and slit scanning. Though the thickness of the photo-curable composition applied onto a substrate varies depending on the use, it can be, for example, 0.01 to 100.0 μm.

Pressing Step (FIG. 1B)

In the pressing step, a mold is brought into contact with the pattern-receiving layer formed from the photo-curable composition applied onto the substrate and is pressed to the layer. As a result, the depression portion of the pattern formed on the mold surface is filled with the photo-curable composition.

The mold can be made of a light permeable material. Specific examples of the material include glass, quartz, PMMA, light permeable resins such as polycarbonate resins, transparent metal vapor-deposited films, flexible films made of, e.g., polydimethylsiloxane, photo-curable films, and metal films.

The surface having protrusions and depressions of a mold may be further provided with a material showing a photocatalytic effect. The photocatalytic effect in the present specification means redox ability, and examples of the material showing a photocatalytic effect include anatase-type titanium dioxide that expresses a photocatalytic effect by irradiation with ultraviolet light. In order to avoid that the irradiation light is blocked by the layer of the material showing a photocatalytic effect disposed on the mold and thereby that the photo-curable composition is prevented from curing, the thickness of the photocatalyst layer is regulated in a range of 0.001 to 0.100 μm, further 0.001 to 0.050 μm.

The gas-generating agent used in this Embodiment can be a compound that does not generate a gas by pressing when the mold is brought into contact with the photo-curable composition, but generates a gas in the gas-generating step described below.

The time for the pressing step is not particularly limited. In general, the time is 1 to 600 seconds, further 1 to 300 seconds, further 1 to 180 seconds, and further 1 to 120 seconds. A contact time shorter than 1 second may cause insufficient filling with the resist, whereas a contact time longer than 600 seconds makes the throughput of the total process low.

The mold used in this Embodiment may be subjected to surface treatment for improving the detachability between the photo-curable composition and the mold surface. Examples of the surface treatment include treatment with a silicone-based coupling agent or a fluorine-based silane coupling agent. Commercially available application-type mold release agents such as Optool DSX manufactured by Daikin Industries, Ltd. also can be used.

The pressure for pressing is not particularly limited. In general, the pressure is 0.1 Pa to 100 MPa, further 0.1 Pa to 50 MPa, further 0.1 Pa to 30 MPa, and further 0.1 Pa to 20 MPa. The method of this Embodiment can be performed under the atmosphere, a reduced-pressure atmosphere, or an inert gas atmosphere. Specific examples of the inert gas include nitrogen, carbon dioxide, helium, argon, and various chlorofluorocarbon gases, and also gas mixtures thereof. The pressure can be 0.0001 to 10 atmospheres. In order to avoid effects of oxygen or moisture on the photo-curing reaction, at least this step may be performed under a reduced-pressure atmosphere or an inert gas atmosphere. The atmosphere in each step may be different.

Curing Step (FIG. 1C)

In the curing step, the photo-curable composition provided with a pattern in the pressing step is irradiated with first light to generate a cured product having the pattern. The photo-curable composition is cured by irradiation with light in the state that the photo-curable composition is in contact with the surface having protrusions and depressions of the mold. That is, a cured product having a pattern of protrusions and depressions reversely corresponding to the protrusions and depressions on the mold surface can be produced.

Though the step of curing the photo-curable composition by irradiation with first light may be performed previous to the gas-generating step described below, these steps may be simultaneously performed.

In this Embodiment, the first light cures the photo-curable composition, but does not generate a gas from the gas-generating agent.

The first light is not particularly limited and is appropriately selected depending on the sensitive wavelength of the photo-curable composition of the present invention. For example, the first light is ultraviolet light having a wavelength of 150 to 400 nm, X-rays, or electron rays. As the photopolymerization initiator (B), a variety of photosensitive compounds showing sensitivity to ultraviolet light are easily available, and therefore ultraviolet light can be particularly used. Examples of a light source emitting ultraviolet light include high-pressure mercury lamps, ultrahigh-pressure mercury lamps, low-pressure mercury lamps, Deep-UV lamps, carbon arc lamps, chemical lamps, metal halide lamps, xenon lamps, KrF excimer lasers, ArF excimer lasers, and $F_2$ excimer lasers. In particular, the ultrahigh-pressure mercury lamps can be used. These radiations may be used alone or in combination. The entire pattern-receiving layer or a part of the pattern-receiving layer may be irradiated with light.

When the photo-curable composition is also heat curable, thermal curing may be further performed. The thermal curing may be performed under any heating atmosphere and any heating temperature. For example, heating can be performed at a temperature of 40 to 200° C. under an inert atmosphere or a reduced-pressure with a hot plate, oven, or furnace.

In this Embodiment, the gas-generating agent also has properties as a surfactant and segregates at the interface between a mold and a curable composition.

Since the gas-generating agent is added to the photo-curable composition, a gas-generating region can be easily formed from the gas-generating agent between a cured product and a mold through the steps shown in FIGS. 1A to 1C, without separately performing a step of adding the gas-generating agent.

The segregation of the gas-generating agent to the gas-generating region may be before the curing, during the curing, or after the curing.

That is, the gas-generating agent forming the gas-generating region may be arranged so as to be supplied from the photo-curable composition, supplied from the cured product, or supplied from the photo-curable composition during the curing.

The gas-generating agent is substantially removed from the inside of the photo-curable composition by the segregation (i.e., the gas-generating agent moves from the inside of the photo-curable composition to the area between the cured product and the mold).

That is, it is possible to provide a state that the generation of a gas in the gas-generating step described below occurs in the gas-generating region between the cured product and the mold and does not substantially occur inside the photo-curable composition. Consequently, the shape of the resulting cured product is less influenced by the gas generation compared with known methods, and thereby a pattern can be formed with higher accuracy.

Gas-Generating Step (FIG. 1D)

In the gas-generating step, the gas-generating region formed between the cured product and the mold is irradiated with second light to generate a gas in the gas-generating region. The gas generated highly contributes to a reduction in peeling force (mold-releasing force) when the mold is released from the cured product.

The second light used herein can be a different type from that of the first light used in the curing step, but may be the same type.

The irradiation with second light may be performed after irradiation with first light or may be performed during irradiation with first light. Alternatively, the irradiation with first light and the irradiation with second light may be simultaneously performed.

The presence of the gas-generating region allows releasing of a mold from a cured product with a weaker peeling force than that necessary for releasing the mold from the cured product when the gas-generating region is not present.

That is, it is possible to selectively generate a gas at the mold/photo-cured product interface by generating a gas in the gas-generating region formed between the mold and the cured product after curing of the photo-curable composition. Consequently, the mold-releasing force can be effectively reduced.

When first light and second light are the same type, the light wavelength, the photo-curable composition, and the gas-generating agent are selected such that the curing rate of the photo-curable composition by light irradiation is faster than the rate of generating a gas from the gas-generating agent.

Furthermore, it is better that the mold surface has a photocatalyst layer when the gas-generating region is irradiated with second light. In such a case, a gas can be generated in the gas-generating region by oxidatively decomposing the gas-generating agent disposed at the interface between the mold and the photo-curable composition by the effect of the photocatalyst.

Mold-Releasing Step (FIG. 1E)

In the mold-releasing step, the mold is released from the cured product. In the mold-releasing in this step, the mold is distantly separated from the cured product so that the surface of the cured product having protrusions and depressions is exposed without destroying the mold. Though the mold can be used again for another photo-curable composition by releasing the mold from the cured product without being destroyed, in the mold-releasing step, a method of partially destroying the mold or partially or completely dissolving the mold with a solvent may be employed, or the mold may be partially destroyed or removed. Such mold-releasing is also encompassed in the present invention.

In the steps described above, a reversely corresponding pattern of the fine pattern formed on the mold is obtained as the pattern of the cured product of the photo-curable composition.

In the steps described above, a gas-generating region is formed from a gas-generating agent between a cured product and a mold, and the gas-generating region is irradiated with second light to generate a gas in the gas-generating region. Consequently, the mold is removed from the cured product with a weaker peeling force than that necessary for releasing the mold from the cured product when the gas-generating region is not present.

The peeling force (mold-releasing force) can be weakened by releasing the mold from the cured product after the generation of a gas or simultaneously with the generation of a gas.

That is, though the mold-releasing step may be performed simultaneously with the gas-generating step, the mold-releasing step can be performed after generation of a desired amount of a gas in the gas-generating region by second light irradiation.

The mold may be removed by any method under any conditions. For example, the mold may be released by fixing the substrate to be processed and shifting the mold so as to depart from the substrate to be processed or by fixing the mold and shifting the substrate to be processed so as to depart from the mold or by pulling both the mold and the substrate in the opposite directions from each other.

Remaining Film-Removing Step (FIG. 1F)

In the remaining film-removing step (exposure step), the film remaining in the depressions of the cured product of the photo-curable composition is removed by etching to expose the surface of the substrate in the depressions of the pattern.

The etching process is not particularly limited, and any known etching process, for example, dry etching with a known dry etching apparatus can be performed. The source gas in dry etching is appropriately selected depending on the element composition of the film to be etched. Examples of the source gas include oxygen-containing gases such as $O_2$, CO, and $CO_2$; inert gases such as He, $N_2$, and Ar; chlorinebased gases such as $Cl_2$ and $BCl_3$; and gases such as $H_2$ and $NH_3$. These gases may be used as a mixture thereof.

Substrate-Processing Step (FIG. 1G)

In the substrate-processing step, the exposed surface of the substrate is processed. The exposed surface of the substrate may be further etched to form a depression.

The pattern formed in the exposure step can be used in a semiconductor integrated circuit, for example, as an interlayer insulating film of a semiconductor device such as an LSI, a system LSI, a DRAM, an SDRAM, an RDRAM, or a D-RDRAM or as a resist film in production a semiconductor device.

Specifically, as shown in FIG. 1G, a circuit structure based on the pattern of the curable composition is formed on the substrate to be processed by etching or ion implantation of the portion exposed in the exposure step. Thus, a circuit board of a semiconductor device can be produced. The pattern of the curable composition may be ultimately removed from the processed substrate or may be remained as a member constituting a device.

In this Embodiment, the depression of the pattern of a mold can have a rectangular cross section, and thereby the protrusion of a pattern can have a rectangular cross section. This allows formation of a pattern having a rectangular cross section by etching and thereby allows formation of a wiring pattern with high accuracy.

Furthermore, the cured product can be used as an optical device having a surface provided with a pattern of protrusions and depressions. That is, it is possible to provide an article including a base material and a cured product of a curable composition disposed on the base material.

That is, a circuit board can also be produced by producing a cured product and forming a circuit structure on the substrate to be processed based on the pattern of the cured product after removal of the mold.

Second Embodiment

FIGS. 2A to 2G are diagrams illustrating Second Embodiment according to the present invention.

This Embodiment is different from First Embodiment in that the gas-generating agent is applied to the surface of the mold instead of being added to the photo-curable composition.

As shown in FIGS. 2A to 2G, the method according to Second Embodiment includes an application step (FIG. 2A) as in First Embodiment. In the application step, a photo-curable composition is applied onto a substrate as a pattern-receiving layer.

Subsequently, a pressing step is performed as in First Embodiment by bringing a mold into contact with the pattern-receiving layer formed from the photo-curable composition applied onto the substrate and pressing the mold to the layer. Prior to this step, however, Second Embodiment includes a step of forming a gas-generating region by applying a gas-generating agent to the surface of the mold.

That is, Second Embodiment is different from First Embodiment in that a mold provided with a gas-generating region on the surface is pressed to the photo-curable composition.

The gas-generating agent, which is described below, can be a gas-generating agent that is not dissolved into the photo-curable composition in the mold pressing step. The use of such a gas-generating agent allows a reduction in thickness of the gas-generating agent layer applied to the mold surface and thereby allows the pattern of protrusions and depressions of the mold to be transferred with high accuracy. The gas-generating agent, however, may be dissolved into the photo-curable composition. In such a gas-generating agent, the layer of the gas-generating agent should be applied so as to have a larger thickness by considering the leaking out.

The gas-generating agent may be applied to the surface of the depression portion and/or the protrusion portion of the mold by any application process. Examples of the application process include ink jetting, dip coating, air knife coating, curtain coating, wire bar coating, gravure coating, extrusion coating, spin coating, and slit scanning.

Though the thickness of the gas-generating agent layer varies depending on the type of the gas-generating agent, for example, the thickness can be 0.001 to 100.0 µm, in particular, 0.01 to 10 µm. When the thickness is less than 0.001 µm, the amount of a gas generated by the gas-generating agent is too small to provide an effect of reducing the mold-releasing force. When the thickness is larger than 100 µm, the pattern of protrusions and depressions of a mold is not sufficiently filled with the photo-curable composition and thereby the pattern of protrusions and depressions may not be transferred with high accuracy.

In this Embodiment, the gas-generating region in the gas-generating step is formed by a process of arranging the gas-generating agent on the surface of the depression portion and/or the protrusion portion of the mold and is a laminar region disposed between the mold and the photo-curable composition.

The curing step (FIG. 2C), the gas-generating step (FIG. 2D), the remaining film-removing step (FIG. 2F), and the substrate-processing step (FIG. 2G) may be performed as in First Embodiment.

In Second Embodiment, unlike in First Embodiment, the gas-generating agent is not required to show interface segregation and therefore can be selected from a variety of gas-generating agents.

Other Embodiments

Furthermore, a gas-generating region may be formed by applying a gas-generating agent on a photo-curable composition applied onto a substrate instead of applying the gas-generating agent to the surface of a mold in Second Embodiment. That is, the present invention is characterized by formation of a gas-generating region from a gas-generating agent between a cured product and a mold, generation of a gas in the gas-generating region irradiating the gas-generating region with second light, and release of the mold from the cured product after the generation of a gas, and any appropriate known process may be employed as long as the features above are implemented.

As obvious from Embodiments described above, the present invention is also useful as a method of producing a cured product having a pattern of protrusions and depressions.

That is, a cured product having a pattern is produced by applying a photo-curable composition onto a base material, bringing a mold having protrusions and depressions on the surface into contact with the photo-curable composition to form a pattern reversely corresponding to the protrusions and depressions of the mold in the photo-curable composition, irradiating the photo-curable composition having the pattern with first light to generate a cured product having the pattern, and releasing the mold from the cured product. The method of producing the cured product having a pattern of protrusions and depressions is characterized by the formation of a gas-generating region from a gas-generating agent between the cured product and the mold, generation of a gas in the gas-generating region by irradiating the gas-generating region with second light, and release of the mold from the cured product after the generation of the gas or simultaneously with the generation of the gas.

Furthermore, the present invention is useful not only as the method of producing a cured product but also as a method of forming a pattern using the method.

That is, in the method of forming a pattern, the pattern is formed in a cured product by applying a photo-curable composition onto a base material, bringing a mold having protrusions and depressions on the surface into contact with the photo-curable composition to form a pattern reversely corresponding to the protrusions and depressions of the mold in the photo-curable composition, irradiating the photo-curable composition having the pattern with first light to generate a cured product having the pattern, and releasing the mold from the cured product. In the method of forming the pattern, a gas-generating region is formed from the gas-generating agent between the cured product and the mold, a gas is generated in the gas-generating region by irradiating the gas-generating region with second light, and the mold is released from the cured product after the generation of the gas or simultaneously with the generation of the gas. Thus, a pattern of protrusions and depressions is formed in the cured product.

Photo-Curable Composition

As described above, the photo-curable composition used in the present invention is a composition cured by means of light and contains a polymerizable monomer (A) and a photopolymerization initiator (B). The photo-curable composition may further optionally contain a gas-generating agent having a segregating property. Furthermore, the photo-curable composition may contain other components.

Polymerizable Monomer (A)

Examples of the polymerizable monomer constituting the photo-curable composition of the present invention include radical polymerizable monomers and cationic polymerizable monomers.

The radical polymerizable monomer can be a compound having at least one acryloyl or methacryloyl group. The cationic polymerizable monomer can be a compound having at least one vinyl ether, epoxy, or oxetanyl group.

Polymerizable Monomer (A): Radical Polymerizable Component

Examples of the monofunctional (meth)acrylic compound having at least one acryloyl or methacryloyl group include, but not limited to, phenoxyethyl (meth)acrylate, phenoxy-2-methylethyl (meth)acrylate, phenoxyethoxyethyl (meth)acrylate, 3-phenoxy-2-hydroxypropyl (meth)acrylate, 2-phenylphenoxyethyl (meth)acrylate, 4-phenylphenoxyethyl (meth)acrylate, 3-(2-phenylphenyl)-2-hydroxypropyl (meth)acrylate, (meth)acrylate of p-cumylphenol reacted with ethylene oxide, 2-bromophenoxyethyl (meth)acrylate, 2,4-dibromophenoxyethyl (meth)acrylate, 2,4,6-tribromophenoxyethyl (meth)acrylate, phenoxy (meth)acrylate modified with multiple moles of ethylene oxide or propylene oxide, polyoxyethylene nonylphenyl ether (meth)acrylate, isobornyl (meth)acrylate, bornyl (meth)acrylate, tricyclodecanyl (meth)acrylate, dicyclopentanyl (meth)acrylate, dicyclopentenyl (meth)acrylate, cyclohexyl (meth)acrylate, 4-butylcyclohexyl (meth)acrylate, acryloyl morpholine, 2-hydroxyethyl (meth)acrylate, 2-hydroxypropyl (meth)acrylate, 2-hydroxybutyl (meth)acrylate, methyl (meth)acrylate, ethyl (meth)acrylate, propyl (meth)acrylate, isopropyl (meth)acrylate, butyl (meth)acrylate, amyl (meth)acrylate, isobutyl (meth)acrylate, t-butyl (meth)acrylate, pentyl (meth)acrylate, isoamyl (meth)acrylate, hexyl (meth)acrylate, heptyl (meth)acrylate, octyl (meth)acrylate, isooctyl (meth)acrylate, 2-ethylhexyl (meth)acrylate, nonyl (meth)acrylate, decyl (meth)acrylate, isodecyl (meth)acrylate, undecyl (meth)acrylate, dodecyl (meth)acrylate, lauryl (meth)acrylate, stearyl (meth)acrylate, isostearyl (meth)acrylate, benzyl (meth)acrylate, tetrahydrofurfuryl (meth)acrylate, butoxyethyl (meth)acrylate, ethoxydiethylene glycol (meth)acrylate, polyethylene glycol mono(meth)acrylate, polypropylene glycol mono(meth)acrylate, methoxyethylene glycol (meth)acrylate, ethoxyethyl (meth)acrylate, methoxypolyethylene glycol (meth)acrylate, methoxypolypropylene glycol (meth)acrylate, diacetone (meth)acrylamide, isobutoxymethyl (meth)acrylamide, N,N-dimethyl (meth)acrylamide, t-octyl (meth)acrylamide, dimethylaminoethyl (meth)acrylate, diethylaminoethyl (meth)acrylate, 7-amino-3,7-dimethyloctyl (meth)acrylate, N,N-diethyl (meth)acrylamide, and N,N-dimethylaminopropyl (meth)acrylamide.

Commercially available examples of the monofunctional (meth)acrylic compound include, but not limited to, Aronix M101, M102, M110, M111, M113, M117, M5700, TO-1317, M120, M150, and M156 (the above listed products are manufactured by Toa Gosei Co., Ltd.), LA, IBXA, 2-MTA, HPA, Viscoat #150, #155, #158, #190, #192, #193, #220, #2000, #2100, and #2150 (the above listed products are manufactured by Osaka Organic Chemical Industry Ltd.), Light Acrylate BO-A, EC-A, DMP-A, THF-A, HOP-A, HOA-MPE, HOA-MPL, PO-A, P-200A, NP-4EA, and NP-BEA, and Epoxy Ester M-600A (the above listed products are manufactured by Kyoeisha Chemical Co., Ltd.), KAYARAD TC110S, R-564, and R-128H (the above listed products are manufactured by Nippon Kayaku Co., Ltd.), NK Ester AMP-10G and AMP-20G (the above listed products are manufactured by Shin-Nakamura Chemical Co., Ltd.), FA-511A, 512A, and 513A (the above listed products are manufactured by Hitachi Chemical Co., Ltd.), PHE, CEA, PHE-2, PHE-4, BR-31, BR-31M, and BR-32 (the above listed products are manufactured by Daiich Kogyo Seiyaku Co., Ltd.), VP (manufactured by BASF), and ACMO, DMAA, and DMAPAA (the above listed products are manufactured by Kohjin Co., Ltd.).

Examples of the multifunctional (meth)acrylic compound having two or more acryloyl or methacryloyl groups include, but not limited to, trimethylolpropane di(meth)acrylate, trimethylolpropane tri(meth)acrylate, EO-modified trimethylolpropane tri(meth)acrylate, PO-modified trimethylolpropane tri(meth)acrylate, EO,PO-modified trimethylolpropane tri(meth)acrylate, pentaerythritol tri(meth)acrylate, pentaerythritol tetra(meth)acrylate, ethylene glycol di(meth)acrylate, tetraethylene glycol di(meth)acrylate, polyethylene glycol di(meth)acrylate, polypropylene glycol di(meth)acrylate, 1,4-butanediol di(meth)acrylate, 1,6-hexanediol di(meth)acrylate, neopentyl glycol di(meth)acrylate, tris(2-hydroxyethyl)isocyanurate tri(meth)acrylate, tris(acryloyloxy)isocyanurate, bis(hydroxymethyl)tricyclodecane di(meth)acrylate, dipentaerythritol penta(meth)acrylate, dipentaerythritol hexa(meth)acrylate, EO-modified 2,2-bis(4-((meth)acryloxy)phenyl)propane, PO-modified 2,2-bis(4-((meth)acryloxy)phenyl)propane, and EO,PO-modified 2,2-bis(4-((meth)acryloxy)phenyl)propane.

Commercially available examples of the multifunctional (meth)acrylic compound include, but not limited to, Yupimer UV SA1002 and SA2007 (the above listed products are manufactured by Mitsubishi Chemical Corp.), Viscoat #195, #230, #215, #260, #335HP, #295, #300, #360, and #700, GPT, and 3PA (the above listed products are manufactured by Osaka Organic Chemical Industry, Ltd.), Light Acrylate 4EG-A, 9EG-A, NP-A, DCP-A, BP-4EA, BP-4PA, TMP-A, PE-3A, PE-4A, and DPE-6A (the above listed products are manufactured by Kyoeisha Chemical Co., Ltd.), KAYARAD PET-30, TMPTA, R-604, DPHA, and DPCA-20, -30, -60, and -120, HX-620, D-310, and D-330 (the above listed products are manufactured by Nippon Kayaku Co., Ltd.), Aronix M208, M210, M215, M220, M240, M305, M309, M310, M315, M325, and M400 (the above listed products are manufactured by Toa Gosei Co., Ltd.), and Ripoxy VR-77, VR-60, and VR-90 (the above listed products are manufactured by Showa Highpolymer Co., Ltd.).

These radical polymerizable monomers may be used alone or in combination of two or more thereof. In the above, the term "(meth)acrylate" includes acrylate and its corresponding methacrylate; the term "(meth)acryloyl group" includes acryloyl group and its corresponding methacryloyl group; the term "EO" refers to ethylene oxide; the term "EO-modified compound" refers to a compound having a block structure of ethylene oxide groups; the term "PO" refers to propylene oxide; and the term "PO-modified compound" refers to a compound having a block structure of propylene oxide groups.

Polymerizable Monomer (A): Cationic Polymerizable Component

Examples of the compound having one vinyl ether group include, but not limited to, methyl vinyl ether, ethyl vinyl ether, propyl vinyl ether, n-butyl vinyl ether, t-butyl vinyl ether, 2-ethylhexyl vinyl ether, n-nonyl vinyl ether, lauryl vinyl ether, cyclohexyl vinyl ether, cyclohexylmethyl vinyl ether, 4-methylcyclohexylmethyl vinyl ether, benzyl vinyl ether, dicyclopentenyl vinyl ether, 2-dicyclopentenoxyethyl vinyl ether, methoxyethyl vinyl ether, ethoxyethyl vinyl ether, butoxyethyl vinyl ether, methoxyethoxyethyl vinyl ether, ethoxyethoxyethyl vinyl ether, methoxypolyethylene glycol vinyl ether, tetrahydrofurfuryl vinyl ether, 2-hydroxyethyl vinyl ether, 2-hydroxypropyl vinyl ether, 4-hydroxybutyl vinyl ether, 4-hydroxymethylcyclohexylmethyl vinyl ether, diethylene glycol monovinyl ether, polyethylene glycol vinyl ether, chloroethyl vinyl ether, chlorobutyl vinyl ether, chloroethoxyethyl vinyl ether, phenylethyl vinyl ether, and phenoxypolyethylene glycol vinyl ether.

Examples of the compound having two or more vinyl ether groups include, but not limited to, divinyl ethers such as ethylene glycol divinyl ether, diethylene glycol divinyl ether, polyethylene glycol divinyl ether, propylene glycol divinyl ether, butylene glycol divinyl ether, hexanediol divinyl ether, bisphenol A alkylene oxide divinyl ether, and bisphenol F alkylene oxide divinyl ether; and multifunctional vinyl ethers such as trimethylolethane trivinyl ether, trimethylolpropane trivinyl ether, ditrimethylolpropane tetravinyl ether, glycerin trivinyl ether, pentaerythritol tetravinyl ether, dipentaerythritol pentavinyl ether, dipentaerythritol hexavinyl ether, an ethylene oxide adduct of trimethylolpropane trivinyl ether, a propylene oxide adduct of trimethylolpropane trivinyl ether, an ethylene oxide adduct of ditrimethylolpropane tetravinyl ether, a propylene oxide adduct of ditrimethylolpropane tetravinyl ether, an ethylene oxide adduct of pentaerythritol tetravinyl ether, a propylene oxide adduct of pentaerythritol tetravinyl ether, an ethylene oxide adduct of dipentaerythritol hexavinyl ether, and a propylene oxide adduct of dipentaerythritol hexavinyl ether.

Examples of the compound having one epoxy group include, but not limited to, phenyl glycidyl ether, p-tert-butylphenyl glycidyl ether, butyl glycidyl ether, 2-ethylhexyl glycidyl ether, allyl glycidyl ether, 1,2-butylene oxide, 1,3-butadiene monooxide, 1,2-epoxydodecane, epichlorohydrin, 1,2-epoxydecane, styrene oxide, cyclohexene oxide, 3-methacryloyloxymethylcyclohexene oxide, 3-acryloyloxymethylcyclohexene oxide, and 3-vinylcyclohexene oxide.

Examples of the compound having two or more epoxy groups include, but not limited to, bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, epoxy novolac resin, hydrogenated bisphenol A diglycidyl ether, hydrogenated bisphenol F diglycidyl ether, hydrogenated bisphenol S diglycidyl ether, 3,4-epoxycyclohexylmethyl-3',4'-epoxycyclohexane carboxylate, 2-(3,4-epoxycyclohexyl-5,5-spiro-3,4-epoxy)cyclohexane-metadioxane, bis(3,4-epoxycyclohexylmethyl) adipate, vinylcyclohexene oxide, 4-vinylepoxycyclohexane, bis(3,4-epoxy-6-methylcyclohexylmethyl) adipate, 3,4-epoxy-6-methylcyclohexyl-3',4'-epoxy-6'-methylcyclohexane carboxylate, methylene bis(3,4-epoxycyclohexane), dicyclopentadiene diepoxide, ethylene glycol di(3,4-epoxycyclohexylmethyl)ether, ethylene bis(3,4-epoxycyclohexane carboxylate), dioctyl epoxyhexahydrophthalate, di-2-ethylhexyl epoxyhexahydrophthalate, 1,4-butanediol diglycidyl ether, 1,6-hexanediol diglycidyl ether, glycerin triglycidyl ether, trimethylolpropane triglycidyl ether, polyethylene glycol diglycidyl ethers, polypropylene glycol diglycidyl ethers, 1,1,3-tetradecadiene dioxide, limonene dioxide, 1,2,7,8-diepoxyoctane, and 1,2,5,6-diepoxycyclooctane.

Examples of the compound having one oxetanyl group include, but not limited to, 3-ethyl-3-hydroxymethyl oxetane, 3-(meth)allyloxymethyl-3-ethyl oxetane, (3-ethyl-3-oxetanylmethoxy)methylbenzene, 4-fluoro-[1-(3-ethyl-3-oxetanylmethoxy)methyl]benzene, 4-methoxy[1-(3-ethyl-3-oxetanylmethoxy)methyl]benzene, [1-(3-ethyl-3-oxetanylmethoxy)ethyl]phenyl ether, isobutoxymethyl(3-ethyl-3-oxetanylmethyl)ether, isobornyloxyethyl(3-ethyl-3-oxetanylmethyl)ether, isobornyl(3-ethyl-3-oxetanylmethyl) ether, 2-ethylhexyl(3-ethyl-3-oxetanylmethyl)ether, ethyldiethylene glycol(3-ethyl-3-oxetanylmethyl)ether, dicyclopentadiene(3-ethyl-3-oxetanylmethyl)ether, dicyclopentenyloxyethyl(3-ethyl-3-oxetanylmethyl)ether, dicyclopentenyl(3-ethyl-3-oxetanylmethyl)ether, tetrahydrofurfuryl(3-ethyl-3-oxetanylmethyl)ether, tetrabromophenyl(3-ethyl-3-oxetanylmethyl)ether, 2-tetrabromophenoxyethyl(3-ethyl-3-oxetanylmethyl)ether, tribromophenyl(3-ethyl-3-oxetanylmethyl)ether, 2-tribromophenoxyethyl(3-ethyl-3-oxetanylmethyl)ether, 2-hydroxyethyl(3-ethyl-3-oxetanylmethyl)ether, 2-hydroxypropyl(3-ethyl-3-oxetanylmethyl)ether, butoxyethyl(3-ethyl-3-oxetanylmethyl)ether, pentachlorophenyl(3-ethyl-3-oxetanylmethyl)ether, pentabromophenyl(3-ethyl-3-oxetanylmethyl)ether, and bornyl(3-ethyl-3-oxetanylmethyl)ether.

Examples of the compound having two or more oxetanyl groups include, but not limited to, 3,7-bis(3-oxetanyl)-5-oxanonane, 3,3'-(1,3-(2-methylenyl)propanediylbis(oxymethylene))bis(3-ethyloxetane), 1,4-bis[(3-ethyl-3-oxetanylmethoxy)methyl]benzene, 1,2-bis[(3-ethyl-3-oxetanylmethoxy)methyl]ethane, 1,3-bis[(3-ethyl-3-oxetanylmethoxy)methyl]propane, ethylene glycol bis(3-ethyl-3-oxetanylmethyl)ether, dicyclopentenyl bis(3-ethyl-3-oxetanylmethyl)ether, triethylene glycol bis(3-ethyl-3-oxetanylmethyl)ether, tetraethylene glycol bis(3-ethyl-3-oxetanylmethyl)ether, tricyclodecane diyldimethylene (3-ethyl-3-oxetanylmethyl)ether, trimethylol propane tris(3-ethyl-3-oxetanylmethyl)ether, 1,4-bis(3-ethyl-3-oxetanylmethoxy)butane, 1,6-bis(3-ethyl-3-oxetanylmethoxy) hexane, pentaerythritol tris(3-ethyl-3-oxetanylmethyl)ether, pentaerythritol tetrakis(3-ethyl-3-oxetanylmethyl)ether, polyethylene glycol bis(3-ethyl-3-oxetanylmethyl)ether, dipentaerythritol hexakis(3-ethyl-3-oxetanylmethyl)ether, dipentaerythritol pentakis(3-ethyl-3-oxetanylmethyl)ether, dipentaerythritol tetrakis(3-ethyl-3-oxetanylmethyl)ether, caprolactone-modified dipentaerythritol hexakis(3-ethyl-3-oxetanylmethyl)ether, caprolactone-modified dipentaerythritol pentakis(3-ethyl-3-oxetanylmethyl)ether, ditrimethylolpropane tetrakis(3-ethyl-3-oxetanylmethyl)ether, EO-modified bisphenol A bis(3-ethyl-3-oxetanylmethyl) ether, PO-modified bisphenol A bis(3-ethyl-3-oxetanylmethyl)ether, EO-modified hydrogenated bisphenol A bis(3-ethyl-3-oxetanylmethyl)ether, PO-modified hydrogenated bisphenol A bis(3-ethyl-3-oxetanylmethyl)ether, and EO-modified bisphenol F (3-ethyl-3-oxetanylmethyl)ether.

These cationic polymerizable monomers may be used alone or in combination of two or more thereof. In the above, the term "EO" refers to ethylene oxide; the term "EO-modified compound" refers to a compound having a block structure of ethylene oxide groups; the term "PO" refers to propylene oxide; and the term "PO-modified compound" refers to a compound having a block structure of propylene oxide groups.

Photopolymerization Initiator (B)

When the polymerizable monomer (A) is a radical polymerizable monomer, the photopolymerization initiator (B) is a photo-radical generator. When the polymerizable monomer (A) is a cationic polymerizable monomer, the photopolymerization initiator (B) is a photo-acid generator.

Photopolymerization Initiator (B): Photo-Radical Generator)

The photo-radical generator is a compound that causes a chemical reaction by irradiation with infrared light, visible light, ultraviolet light, far ultraviolet light, X-rays, charged particle rays such as electron rays, or radiation rays to generate a radical and initiates radical polymerization.

Examples of the photo-radical generator include, but not limited to, optionally substituted 2,4,5-triarylimidazole dimers such as a 2-(o-chlorophenyl)-4,5-diphenylimidazole dimer, a 2-(o-chlorophenyl)-4,5-di(methoxyphenyl)imidazole dimer, a 2-(o-fluorophenyl)-4,5-diphenylimidazole dimer, and a 2-(o- or p-methoxyphenyl)-4,5-diphenylimidazole dimer; benzophenone derivatives such as benzophenone, N,N'-tetramethyl-4,4'-diaminobenzophenone (Michler's ketone), N,N'-tetraethyl-4,4'-diaminobenzophenone, 4-methoxy-4'-dimethylaminobenzophenone, 4-chlorobenzophenone, 4,4'-dimethoxybenzophenone, and 4,4'-diaminobenzophenone; aromatic ketone derivatives such as 2-benzyl-2-dimethylamino-1-(4-morpholinophenyl)-butanone-1,2-methyl-1-[4-(methylthio)phenyl]-2-morpholinopropanon-1-one; quinones such as 2-ethylanthraquinone, phenanthrenequinone, 2-t-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyl-1,4-naphthoquinone, and 2,3-dimethylanthraquinone; benzoin ether derivatives such as benzoin methyl ether, benzoin ethyl ether, and benzoin phenyl ether; benzoin derivatives such as benzoin, methyl benzoin, ethyl benzoin, and propyl benzoin; benzyl derivatives such as benzyl dimethyl ketal; acridine derivatives such as 9-phenyl acridine and 1,7-bis(9,9'-acridinyl)heptane; N-phenylglycine derivatives such as N-phenylglycine; acetophenone derivatives such as acetophenone, 3-methylacetophenone, acetophenone benzyl ketal, 1-hydroxycyclohexylphenyl ketone, and 2,2-dimethoxy-2-phenylacetophenone; thioxanthone derivatives such as thioxanthone, diethylthioxanthone, 2-isopropylthioxanthone, and 2-chlorothioxanthone; xanthones; fluorenones; benzaldehydes; fluorenes; anthraquinones; triphenylamines; carbazoles; and 1-(4-isopropylphenyl)-2-hydroxy-2-methylpropan-1-one, 2-hydroxy-2-methyl-1-phenylpropan-1-one, 2,4,6-trimethylbenzoyldiphenylphosphine oxide, and bis(2,6-dimethoxybenzoyl)-2,4,4-trimethylpentylphosphine oxide. These may be used alone or in combination of two or more thereof.

Commercially available examples of the photo-radical generator include, but not limited to, Irgacure 184, 369, 651, 500, 819, 907, 784, and 2959, CGI-1700, -1750, and -1850, CG24-61, and Darocur 1116 and 1173 (the above listed products are manufactured by Ciba Japan), Lucirin TPO, LR8893, and LR8970 (the above listed products are manufactured by BASF), and Uvecryl P36 (manufactured by UCB).

Photopolymerization Initiator (B): Photo-Acid Generator

The photo-acid generator is a compound that causes a chemical reaction by irradiation with infrared light, visible light, ultraviolet light, far ultraviolet light, X-rays, charged particle rays such as electron rays, or radiation rays to generate an acid and initiates cationic polymerization. Examples of the compound include, but not limited to, onium salt compounds, sulfone compounds, sulfonic acid ester compounds, sulfonimide compounds, and diazomethane compounds. In particular, the onium salt compounds can be used in the present invention.

Examples of the onium salt compound include, but not limited to, iodonium salts, sulfonium salts, phosphonium salts, diazonium salts, ammonium salts, and pyridinium salts. Specific examples of the onium salt compounds include, but not limited to, bis(4-t-butylphenyl)iodonium perfluoro-n-butanesulfonate, bis(4-t-butylphenyl)iodonium trifluoromethanesulfonate, bis(4-t-butylphenyl)iodonium 2-trifluoromethylbenzenesulfonate, bis(4-t-butylphenyl)iodonium pyrenesulfonate, bis(4-t-butylphenyl)iodonium n-dodecylbenzenesulfonate, bis(4-t-butylphenyl)iodonium p-toluenesulfonate, bis(4-t-butylphenyl)iodonium benzenesulfonate, bis(4-t-butylphenyl)iodonium 10-camphorsulfonate, bis(4-t-butylphenyl)iodonium n-octanesulfonate, diphenyliodonium perfluoro-n-butanesulfonate, diphenyliodonium trifluoromethanesulfonate, diphenyliodonium 2-trifluoromethylbenzenesulfonate, diphenyliodonium pyrenesulfonate, diphenyliodonium n-dodecylbenzenesulfonate, diphenyliodonium p-toluenesulfonate, diphenyliodonium benzenesulfonate, diphenyliodonium 10-camphorsulfonate, diphenyliodonium n-octanesulfonate, triphenylsulfonium perfluoro-n-butanesulfonate, triphenylsulfonium trifluoromethanesulfonate, triphenylsulfonium 2-trifluoromethylbenzenesulfonate, triphenylsulfonium pyrenesulfonate, triphenylsulfonium n-dodecylbenzenesulfonate, triphenylsulfonium p-toluenesulfonate, triphenylsulfonium benzenesulfonate, triphenylsulfonium 10-camphorsulfonate, triphenylsulfonium n-octanesulfonate, diphenyl(4-t-butylphenyl)sulfonium perfluoro-n-butanesulfonate, diphenyl(4-t-butylphenyl)sulfonium trifluoromethanesulfonate, diphenyl(4-t-butylphenyl)sulfonium 2-trifluoromethylbenzenesulfonate, diphenyl(4-t-butylphenyl)sulfonium pyrenesulfonate, diphenyl(4-t-butylphenyl) sulfonium n-dodecylbenzenesulfonate, diphenyl(4-t-butylphenyl)sulfonium p-toluenesulfonate, diphenyl(4-t-butylphenyl)sulfonium benzenesulfonate, diphenyl(4-t- butylphenyl)sulfonium 10-camphorsulfonate, diphenyl(4-t-butylphenyl)sulfonium n-octanesulfonate, tris(4-methoxyphenyl)sulfonium perfluoro-n-butanesulfonate, tris (4-methoxyphenyl)sulfonium trifluoromethanesulfonate, tris(4-methoxyphenyl)sulfonium 2-trifluoromethylbenzenesulfonate, tris(4-methoxyphenyl)sulfonium pyrenesulfonate, tris(4-methoxyphenyl)sulfonium n-dodecylbenzenesulfonate, tris(4-methoxyphenyl)sulfonium p-toluenesulfonate, tris(4-methoxyphenyl)sulfonium benzenesulfonate, tris(4-methoxyphenyl)sulfonium 10-camphorsulfonate, and tris(4-methoxyphenyl)sulfonium n-octanesulfonate.

Examples of the sulfone compound include, but not limited to, β-ketosulfone, β-sulfonylsulfone, and α-diazo compounds thereof. Specific examples of the sulfone compound include, but not limited to, phenacyl phenyl sulfone, mesityl phenacyl sulfone, bis(phenylsulfonyl)methane, and 4-trisphenacyl sulfone.

Examples of the sulfonic acid ester compound include, but not limited to, alkylsulfonic acid esters, haloalkylsulfonic acid esters, arylsulfonic acid esters, and iminosulfonates. Specific examples of the sulfonic acid ester compound include, but not limited to, α-methylolbenzoin perfluoro-n-butanesulfonate, α-methylolbenzoin trifluoromethanesulfonate, and α-methylolbenzoin 2-trifluoromethylbenzenesulfonate.

Examples of the sulfonimide compound include, but not limited to, N-(trifluoromethylsulfonyloxy)succinimide, N-(trifluoromethylsulfonyloxy)phthalimide, N-(trifluoromethylsulfonyloxy)diphenylmaleimide, N-(trifluoromethylsulfonyloxy)bicyclo[2.2.1]hept-5-ene-2,3-dicarboxyimide, N-(trifluoromethylsulfonyloxy)-7-oxabicyclo[2.2.1]hept-5-ene-2,3-dicarboxyimide, N-(trifluoromethylsulfonyloxy)bicyclo[2.2.1]heptane-5,6-oxy-2,3-dicarboxyimide, N-(trifluoromethylsulfonyloxy)naphthylimide, N-(10-camphorsulfonyloxy)succinimide, N-(10-camphorsulfonyloxy)phthalimide, N-(10-camphorsulfonyloxy)diphenylmaleimide, N-(10-camphorsulfonyloxy)bicyclo[2.2.1]hept-5-ene-2,3-dicarboxyimide, N-(10-camphorsulfonyloxy)-7-oxabicyclo[2.2.1]hept-5-ene-2,3-dicarboxyimide, N-(10-camphorsulfonyloxy)bicyclo[2.2.1]heptane-5,6-oxy-2,3-dicarboxyimide, N-(10-camphorsulfonyloxy)naphthylimide, N-(4-methylphenylsulfonyloxy)succinimide, N-(4-methylphenylsulfonyloxy)phthalimide, N-(4-methylphenylsulfonyloxy)diphenylmaleimide, N-(4-methylphenylsulfonyloxy)bicyclo[2.2.1]hept-5-ene-2,3-dicarboxyimide, N-(4-methylphenylsulfonyloxy)-7-oxabicyclo[2.2.1]hept-5-ene-2,3-dicarboxyimide, N-(4-methylphenylsulfonyloxy)bicyclo[2.2.1]heptane-5,6-oxy-2,3-dicarboxyimide, N-(4-methylphenylsulfonyloxy)naphthylimide, N-(2-trifluoromethylphenylsulfonyloxy)succinimide, N-(2-trifluoromethylphenylsulfonyloxy)phthalimide, N-(2-trifluoromethylphenylsulfonyloxy)diphenylmaleimide, N-(2-trifluoromethylphenylsulfonyloxy)bicyclo[2.2.1]hept-5-ene-2,3-dicarboxyimide, N-(2-trifluoromethylphenylsulfonyloxy)-7-oxabicyclo[2.2.1]hept-5-ene-2,3-dicarboxyimide, N-(2-trifluoromethylphenylsulfonyloxy)bicyclo[2.2.1]heptane-5,6-oxy-2,3-dicarboxyimide, N-(2-trifluoromethylphenylsulfonyloxy)naphthylimide, N-(4-fluorophenylsulfonyloxy)succinimide, N-(4-fluorophenyl) phthalimide, N-(4-fluorophenylsulfonyloxy)diphenylmaleimide, N-(4-fluorophenylsulfonyloxy)bicyclo[2.2.1]hept-5-ene-2,3-dicarboxyimide, N-(4-fluorophenylsulfonyloxy)-7-oxabicyclo[2.2.1]hept-5-ene-2,3-dicarboxyimide, N-(4-fluorophenylsulfonyloxy)bicyclo[2.2.1]heptane-5,6-oxy-2,3-dicarboxyimide, and N-(4-fluorophenylsulfonyloxy) naphthylimide.

Examples of the diazomethane compound include, but not limited to, bis(trifluoromethylsulfonyl)diazomethane, bis (cyclohexylsulfonyl)diazomethane, bis(phenylsulfonyl)diazomethane, bis(p-toluenesulfonyl)diazomethane, methylsulfonyl p-toluenesulfonyldiazomethane, (cyclohexylsulfonyl)(1,1-dimethylethylsulfonyl)diazomethane, and bis(1,1-dimethylethylsulfonyl)diazomethane.

In these photo-acid generators, in particular, onium salt compounds can be used. In the present invention, the photo-acid generators may be used alone or in combination of two or more thereof.

The amount of the photopolymerization initiator (B) can be 0.01% by mass or more and 10% by mass or less, in particular, 0.1% by mass or more and 7% by mass or less of the total mass of the polymerizable monomer (A) of the present invention. When the amount is less than 0.01% by mass, the curing rate is slow, which may reduce the reaction efficiency. In contrast, an amount of higher than 10% by mass may cause deterioration in mechanical characteristics of the cured product of the photo-curable composition.

Gas-Generating Agent

The gas-generating agent is defined as a material that generates a gas through photoreaction or oxidative decomposition by irradiation with light having a desired wavelength. The gas-generating agent that causes oxidative decomposition to generate a gas is used in the case of disposing a photocatalyst layer on the surface of the mold, described below.

Examples of the gas-generating agent that causes photoreaction include azo compounds, diazonium salt compounds, azide compounds, diazonaphthoquinone compounds, sulfohydrazide compounds, hydrazo compounds, nitrobenzylcarbamate compounds, benzoincarbamate compounds, and diazomethanesulfonate compounds. The gas to be generated is carbon dioxide, carbon monoxide, nitrogen, oxygen, or hydrogen and, in particular, carbon dioxide or nitrogen. For example, azide compounds and diazonaphthoquinone compounds generate nitrogen, and nitrobenzylcarbamate compounds and benzoincarbamate compounds generate carbon dioxide.

Among the gas-generating agents described above, when a gas-generating agent that causes photoreaction is used in a process of disposing a gas-generating region at the interface between a mold and a curable composition by adding the gas-generating agent to the photo-curable composition, the gas-generating agent can have characteristics as a surfactant. That is, the gas-generating agent can be one having a fluoroalkyl group showing an interface segregation effect and thereby segregates at the interface between a mold and a photo-curable composition.

The gas-generating agent is decomposed by oxidation or reduction due to a photocatalytic effect and is composed of a gas-generating molecule that generates a gas such as carbon dioxide and a protective molecule that is not decomposed by a photocatalyst. A gas-generating molecule having a carboxylic acid, aldehyde, or primary alcohol as a functional group is readily oxidatively or reductively decomposed by a photocatalyst and, therefore, can be particularly used. As the protective molecule, a fluoroalkyl chain is hardly decomposed by a photocatalyst and, therefore, can be particularly used.

In the case of disposing a photocatalyst layer on the mold surface to accelerate the generation of a gas by the gas-generating agent, the gas-generating agent can have a molecule that readily generates carbon dioxide by oxidation with a photocatalytic effect, such as a carboxylic acid, aldehyde, or primary alcohol, as a functional group.

Other Components

The photo-curable composition of the present invention may contain, in addition to the polymerizable monomer (A) and the photopolymerization initiator (B), a sensitizer, an antioxidant, a solvent, a polymer component, and other additives according to various purposes in the ranges that do not impair the effects of the present invention.

Other Components: Sensitizer

The sensitizer may be added to the composition in order to accelerate the polymerization or increase the reaction conversion rate. The sensitizer is, for example, a hydrogen donor or a sensitizing dye.

The hydrogen donor is a compound that reacts with an initial radical generated from the photopolymerization initiator (B) or a radical of the growing polymer end to generate a radical having higher reactivity. When the photopolymerization initiator (B) is a photo-radical generator, the hydrogen donor can be added to the curable composition.

The hydrogen donor may be one that is well-known and usually used, and specific examples thereof include, but not limited to, amine compounds such as N-butylamine, di-n-butylamine, tri-n-butylphosphine, allylthiourea, s-benzylisothiuronium-p-toluene sulfinate, triethylamine, diethylaminoethyl methacrylate, triethylenetetramine, 4,4'-bis(dialkylamino)benzophenone, N,N-dimethylaminobenzoic acid ethyl ester, N,N-dimethylaminobenzoic acid isoamyl ester, pentyl-4-dimethylamino benzoate, triethanolamine, and N-phenylglycine; and mercapto compounds such as 2-mercapto-N-phenylbenzimidazole and mercaptopropionic acid ester.

The sensitizing dye is a compound that is excited by absorbing light of a specific wavelength and has interactivity with the photopolymerization initiator (B). The interactivity herein is energy transfer or electron transfer from the sensitizing dye in the excited state.

The sensitizing dye may be one that is well-known and usually used, and specific examples thereof include, but not limited to, anthracene derivatives, anthraquinone derivatives, pyrene derivatives, perylene derivatives, carbazole derivatives, benzophenone derivatives, thioxanthone derivatives, xanthone derivatives, coumarin derivatives, phenothiazine derivatives, camphorquinone derivatives, acridine dyes, thiopyrylium salt dyes, merocyanine dyes, quinoline dyes, styrylquinoline dyes, ketocoumarin dyes, thioxanthene dyes, xanthene dyes, oxonol dyes, cyanine dyes, rhodamine dyes, and pyrylium salt dyes.

The sensitizers may be used alone or in combination of two or more thereof.

The amount of the sensitizer in the photo-curable composition can be 0 to 20% by mass, further 0.1 to 5.0% by mass, and further 0.2 to 2.0% by mass, of the total amount of the polymerizable monomer (A). In an amount of 0.1% by mass or more of the sensitizer, the effect of the sensitizer can be more effectively expressed. In an amount of 5.0% by mass or less, the photo-cured product can have a sufficiently high molecular weight and is prevented from insufficient dissolution or from deterioration in storage stability.

Blending of Composition

The photo-curable composition of the present invention can be prepared by mixing the above-described components. The photo-curable composition is usually mixed and dissolved in a temperature range of 0 to 100° C.

Physical Property of Composition: Viscosity

The photo-curable composition of the present invention as a mixture of components excluding the solvent can have a viscosity at 23° C. of 1 to 100 cP, further 5 to 50 cP, further 6 to 20 cP. If the viscosity is higher than 100 cP, in the mold-pressing step, it takes a long time to fill the depressions of a fine pattern on a mold with the composition or pattern defaults due to filling failure occurs. If the viscosity is lower than 1 cP, the application becomes uneven in the application step, and the composition may flow out from the mold end in the mold-pressing step.

Physical Property of Composition: Surface Tension

The photo-curable composition of the present invention as a mixture of components excluding the solvent can have a surface tension at 23° C. of 5 to 70 mN/m, further 7 to 35 mN/m, and further 10 to 32 mN/m.

If the surface tension is lower than 5 mN/m, in the mold-pressing step, it takes a long time to fill the fine pattern on the surface of a mold with the composition. If the surface tension is higher than 70 mN/m, the surface has lower smoothness.

Physical Property of Composition: Particles

In order to prevent occurrence of defaults in pattern by contaminated particles, the mixture of components of the photo-curable composition may be filtered through, for example, a filter having a pore diameter of 0.001 to 5.0 µm. The filtration can be multi-stage filtration or may be repeated multiple times. The filtrate may be re-filtered. The filter may be made of any material, such as a polyethylene resin, a polypropylene resin, a fluorine resin, or a nylon resin.

Physical Property: Metal Impurities

In the photo-curable composition for producing a semiconductor integrated circuit, contamination of metal impurities in the composition should be prevented as much as possible in order to avoid obstruction in behavior of the product. Accordingly, the concentration of metal impurities in the photo-curable composition of the present invention should be 10 ppm or less, in particular, 100 ppb or less.

The present invention will now be described in more detail by the following Example, but the technical scope of the present invention is not limited to the following Example.

Example 1

A solution mixture composed of 100 parts by mass of 1,6-hexanediol diacrylate (HDODA, manufactured by Osaka Organic Chemical Industry, Ltd.) serving as Component (A), 3 parts by mass of Irgacure 369 (manufactured by Ciba Japan) serving as Component (B), and 2 parts by mass of a fluorine-containing surfactant having a carboxylic acid group serving as Component (C) is prepared. The fluorine-containing surfactant having a carboxylic acid group can be Fluorolink-C (registered trademark, manufactured by Solvay Solexis S.P.A.). This surfactant is a polymer having a structural formula represented by $HOOC-CF_2O(CF_2CF_2O)_n(CF_2O)_mCF_2-COOH$ (n and m are each an integer) and an average molecular weight of 1800.

The resulting solution mixture is filtered through a tetrafluoroethylene filter having a pore size of 0.2 µm to prepare a photo-curable composition (a-1).

Fifteen microliters of the composition (a-1) is dropwise applied with a micropipette onto a 4-inch silicon wafer having a 60-nm thickness adhesion-accelerating layer as an adhesion layer.

A quartz plate having a titanium dioxide film is placed on the silicon wafer in such a manner that the surface of the titanium dioxide film is in contact with the photo-curable composition (a-1).

A UV light source EXECURE 3000 (manufactured by HOYA CANDEO OPTRONICS Corporation) equipped with a 200-W mercury-xenon lamp is used as the irradiation light source.

An interference filter VPF-50C-10-25-36500 (manufactured by Sigma Koki Co., Ltd.) is disposed between the light source and the quartz mold. The illuminance directly under the quartz mold is set to be 1 mW/cm$^2$ at a wavelength of 365 nm. The curing step with first light is performed under the conditions described above for 60 seconds.

Subsequently, as the gas-generating step with second light, the titanium dioxide and the photo-curable composition are irradiated with UV light having a wavelength of 250 nm at an illuminance of 30 mW/cm$^{-1}$ through the quartz plate for 600 seconds.

After the gas-generating step, a mold-releasing step is performed by lifting the quartz mold at a speed of 0.5 mm/s. The fluorine-containing surfactant contained in the photo-curable composition segregates at the interface between the photo-curable composition and the mold. Since a gas-generating region is thus segregated at the curable composition/mold interface by that the photo-curable composition contains the fluorine-containing surfactant as the gas-generating agent, a photo-cured product having good mold releasability and high pattern accuracy is provided.

The following reference experiments will describe that the above-described Example is possible.

Reference Experiment 1: Measurement of Oxidative Decomposition of Gas-Generating Agent by Photocatalyst In order to pursue the oxidative decomposition process through the photocatalytic effect of an organic compound having a fluoroalkyl chain and a carboxylic acid at the end, ATR-IR of the organic compound was measured before and after the decomposition. The apparatuses used for measurement and UV light irradiation were as follows:

Measurement apparatus: FTS7000 (Agilent Technologies, Inc.)

UV light irradiation apparatus: EX-250 (HOYA-SCHOTT Corp.)

Prism: half cylinder silicon prism

Figure 3:
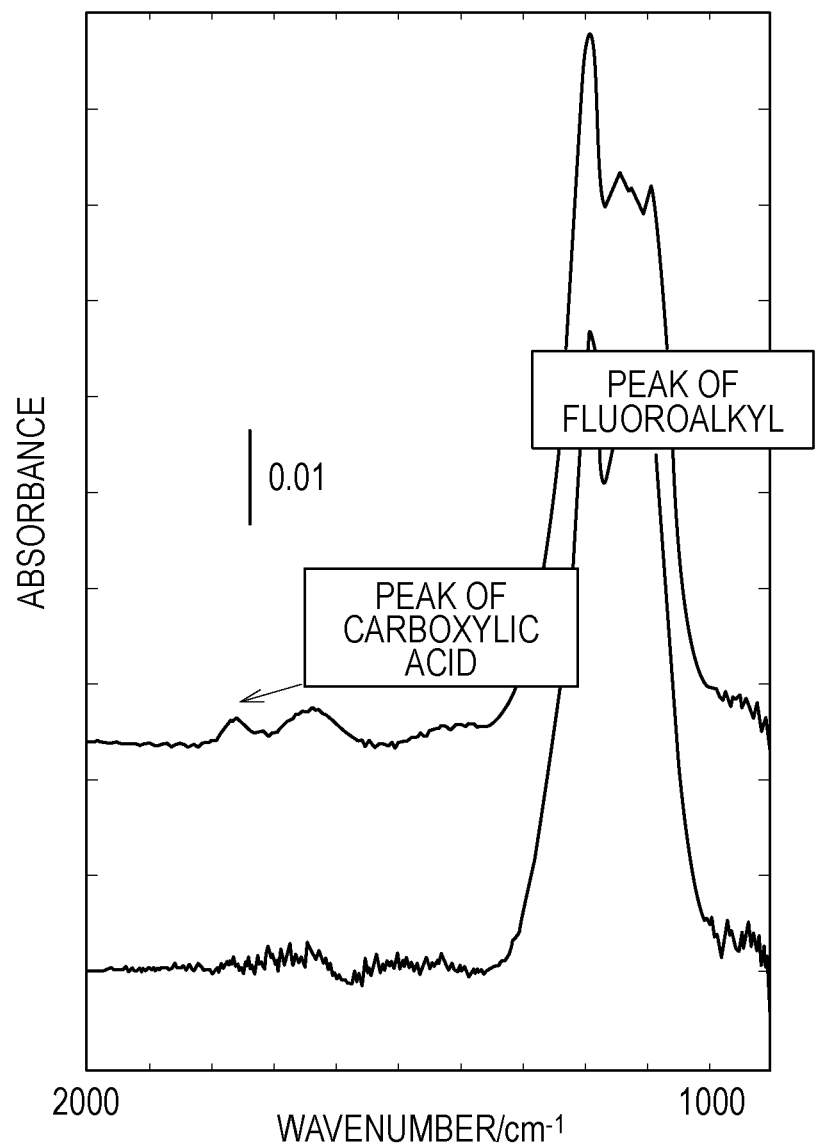
FIG. 3 is a graph showing the results of reference experiment 1.

Ten microliters of a fluorine-containing surfactant having a carboxylic acid group was dropwise applied onto a Si prism. A quartz plate provided with a titanium dioxide film was placed on the Si prism in such a manner that the surface of the titanium dioxide film was in contact with the surfactant. The titanium dioxide and the surfactant were irradiated with UV light having a wavelength of 250 nm at an illuminance of 30 mW/cm$^{-1}$ through the quartz plate for 600 seconds, and then the infrared spectrum was measured by FTIR. FIG. 3 shows the resulting spectrum. The surfactant used had a carboxylic acid as a functional group, and the absorption peak by this functional group generally appeared at near 1700 cm$^{-1}$. In the infrared spectrum shown in FIG. 3, however, such an absorption peak was not observed. That is, it was confirmed that the photocatalyst being in contact with the surfactant expressed its redox ability by UV light irradiation and decomposed the carboxylic acid of the surfactant.

Thus, the use of a surfactant having a carboxylic acid allows generation of a gas by a photocatalyst at the curable composition/mold interface and provides a photo-cured product having good mold releasability and high pattern accuracy.

Reference Experiment 2: Effect of Segregation of Surfactant and Formation of Photo-Cured Product A solution mixture composed of 100 parts by mass of 1,6-hexanediol diacrylate (HDODA, manufactured by Osaka Organic Chemical Industry, Ltd.) serving as Component (A), 3 parts by mass of Irgacure 369 (manufactured by Ciba Japan) serving as Component (B), and 2 parts by mass of a fluorine-containing surfactant (molecular formula: $CF_3(CF_2)_5CH_2(OCH_2CH_2)_6OH$) serving as Component (C) was prepared. The resulting solution mixture was filtered through a tetrafluoroethylene filter having a pore size of 0.2 µm to prepare a photo-curable composition (a-1).

Fifteen microliters of the composition (a-1) was dropwise applied with a micropipette onto a 4-inch silicon wafer having a 60-nm thickness adhesion-accelerating layer as an adhesion layer.

A quartz mold of 40×40 mm not subjected to surface treatment and not provided with any pattern was brought into contact with the silicon wafer.

The UV light source EXECURE 3000 mentioned above was used as the irradiation light source. An interference filter VPF-50C-10-25-36500 was disposed between the light source and the quartz mold. The illuminance directly under the quartz mold was 1 mW/cm$^2$ at a wavelength of 365 nm.

The light irradiation process was performed for 60 seconds under the conditions mentioned above.

A mold-releasing step was performed by lifting the quartz mold at a speed of 0.5 mm/s.

Measurement of XPS

The surface of the photo-curable composition cured on the silicon wafer was measured by X-ray photoelectron spectroscopy (XPS) after releasing from the quartz mold. The XPS analysis was performed with Quantera SXM™ manufactured by Ulvac-Phi, Inc. The measurement conditions are summarized below. The measurement was performed by angle-resolved analysis.

Beam diameter: 100 (µm)

X-ray incident angle: 7, 15, 30, 45, 60, 75, and 90(°)

Beam output: 25 (W)

Acceleration voltage: 15 (kV)

Figure 4:
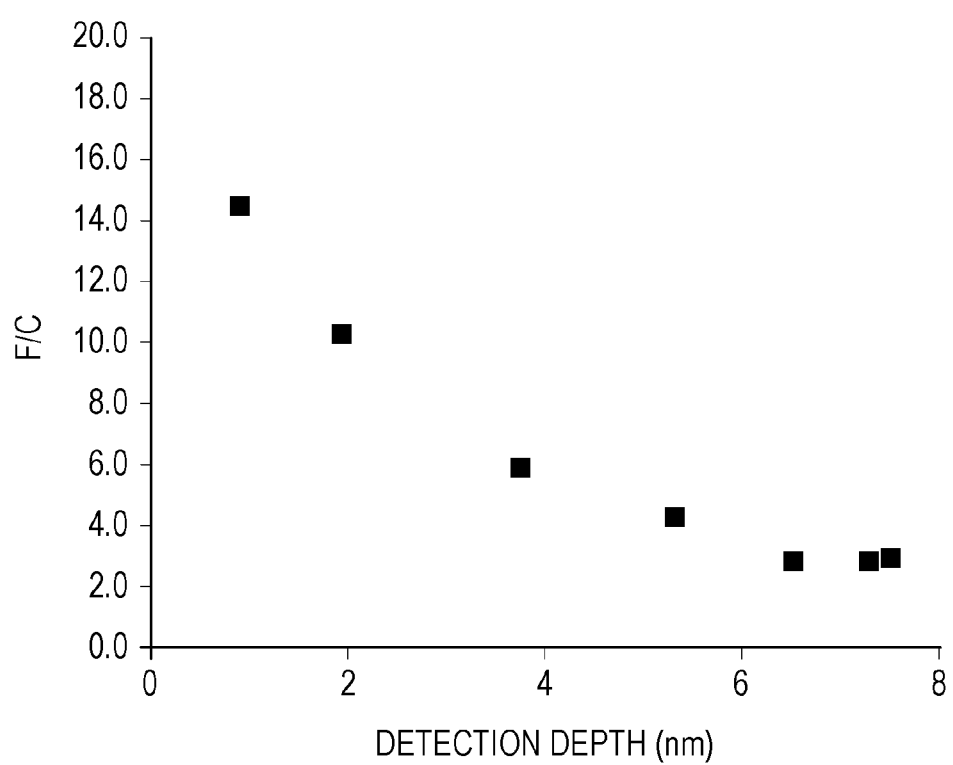
FIG. 4 is a graph showing the results of reference experiment 2.

In the angle-resolved analysis, the incident angle of X-rays is changed with respect to the surface of a curable composition to change the escape depth of photoelectrons generated by incident X-rays, i.e., measurement depth from the sample surface. In this experiment, the measurement was performed by changing the X-ray incident angles to 7, 15, 30, 45, 60, 75, and 90(°) and estimating the respective measurement depths to be 0.91, 1.94, 3.75, 5.30, 6.50, 7.24, and 7.50 (nm). FIG. 4 shows a graph obtained by plotting intensity ratios of measured photoelectrons F1s to C1s versus the measurement depths. FIG. 4 reveals that the value of F1s/C1s increases with a reduction in measurement depth. That is, it was confirmed that the fluorine-containing surfactant added to the photo-curable composition segregated at the interface between the photo-curable composition and the mold.

Thus, the gas-generating agent can segregate a gas-generating region at the curable composition/mold interface by adding a fluorine-containing surfactant to the photo-curable composition, and thereby a photo-cured product having good mold releasability and high pattern accuracy is provided.

Reference Experiment 3: Measurement of Contact Angle

One microliter of the photo-curable composition (a-1) was dropwise applied onto a quartz plate with an automatic contact angle meter CA-W (manufactured by Kyowa Interface Science Co., Ltd.), and the contact angle was measured to be 39°.

Reference Comparative Example: Measurement of Contact Angle

One microliter of a solution mixture composed of 100 parts by mass of 1,6-hexanediol diacrylate (HDODA, manufactured by Osaka Organic Chemical Industry, Ltd.) and 3 parts by mass of Irgacure 369 (manufactured by Ciba Japan) was dropwise applied onto a quartz plate with an automatic contact angle meter CA-W (manufactured by Kyowa Interface Science Co., Ltd.), and the contact angle was measured to be 7°.

That is, the contact angle of the photo-curable composition before curing with a quartz substrate was increased by adding the surfactant to the photo-curable composition. This result shows that the surface tension of the photo-curable composition changed and that the surfactant was present on the surface of the curable composition immediately after the application.

The results of reference experiments 1 to 3 show that the specific example shown in Example 1 is feasible. The Example 1 can be appropriately modified or improved based on the usual knowledge of those skilled in the art, and such modifications and improvements are also encompassed in the scope of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-277713, filed Dec. 19, 2011, which is hereby incorporated by reference herein in its entirety.

The invention claimed is:

1. A method of producing a circuit board, comprising:
    applying a photo-curable composition onto a substrate to be processed;
    pressing a mold to the photo-curable composition to form a pattern in the photo-curable composition;
    irradiating the photo-curable composition provided with the pattern with first light to generate a cured product having the pattern;
    forming a gas-generating region from a gas-generating agent between the cured product and the mold;
    irradiating the gas-generating region with second light to generate a gas in the gas-generating region;
    releasing the mold from the cured product after the generation of the gas or simultaneously with the generation of the gas; and
    forming a circuit structure on the substrate to be processed on the basis of the pattern of the cured product,
    wherein the gas-generating agent is a surfactant having a functional group for generating a gas.

2. The method of producing a circuit board according to claim 1, wherein the circuit board is a semiconductor device.

3. A method of producing a cured product having a pattern of protrusions and depressions, comprising:
    applying a photo-curable composition onto a base material;
    bringing a mold having protrusions and depressions on its surface into contact with the photo-curable composition to form a pattern reversely corresponding to the protrusions and depressions of the mold in the photo-curable composition;
    irradiating the photo-curable composition provided with the pattern with first light to generate a cured product having the pattern; and
    releasing the mold from the cured product, wherein
    a gas-generating region is formed from a gas-generating agent between the cured product and the mold;
    the gas-generating region is irradiated with second light to generate a gas in the gas-generating region;
    the mold is released from the cured product after the generation of the gas or simultaneously with the generation of the gas; and
    the gas-generating agent is a fluorine-containing surfactant having a functional group for generating a gas.

4. The method of producing a cured product according to claim 3, wherein the first light and the second light are different types from each other.

5. The method of producing a cured product according to claim 3, wherein the irradiation with second light is performed after the irradiation with first light.

6. The method of producing a cured product according to claim 3, wherein the mold is released from the cured product with a weaker peeling force than that necessary for releasing the mold from the cured product when the gas-generating region is not present.

7. A method of forming a pattern of protrusions and depressions in a cured product, comprising
    applying a photo-curable composition onto a base material;
    bringing a mold having protrusions and depressions on its surface into contact with the photo-curable composition to form a pattern reversely corresponding to the protrusions and depressions of the mold in the photo-curable composition;
    irradiating the photo-curable composition provided with the pattern with first light to generate a cured product having the pattern; and
    releasing the mold from the cured product, wherein
    a gas-generating region is formed from a gas-generating agent between the cured product and the mold;
    the gas-generating region is irradiated with second light to generate a gas in the gas-generating region;
    the mold is released from the cured product after the generation of the gas or simultaneously with the generation of the gas; and
    the gas-generating agent is a surfactant having a functional group for generating a gas, and the gas-generating region comprises a photocatalyst.

* * * * *